(12) United States Patent
Jennings et al.

(10) Patent No.: US 11,121,504 B2
(45) Date of Patent: Sep. 14, 2021

(54) CIRCUIT BOARD SEPARATION MECHANISM

(71) Applicant: Rockwell Collins, Inc., Cedar Rapids, IA (US)

(72) Inventors: Martin J. Jennings, Oxford, IA (US); Robert C. Mitchell, Center Point, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 16/780,631

(22) Filed: Feb. 3, 2020

(65) Prior Publication Data
US 2021/0242630 A1 Aug. 5, 2021

(51) Int. Cl.
*H01R 13/635* (2006.01)
*H01R 12/71* (2011.01)
(Continued)

(52) U.S. Cl.
CPC ......... *H01R 13/635* (2013.01); *H01R 12/716* (2013.01); *H05K 1/0203* (2013.01); *H05K 1/144* (2013.01); *H05K 1/181* (2013.01); *H05K 7/20854* (2013.01); *H01R 2201/26* (2013.01); *H05K 2201/042* (2013.01); *H05K 2201/066* (2013.01); *H05K 2201/10189* (2013.01); *H05K 2201/10409* (2013.01)

(58) Field of Classification Search
CPC .. H01R 13/635; H01R 12/716; H05K 1/0203; H05K 1/144; H05K 1/181
USPC .......................................................... 439/65
See application file for complete search history.

(56) References Cited

U.S. PATENT DOCUMENTS 3,848,953 A * 11/1974 Petroshanoff ........ H05K 7/1407
439/327
4,990,095 A * 2/1991 Walkup ................ H01R 13/635
439/152
(Continued)

FOREIGN PATENT DOCUMENTS

WO 2016115205 A1 7/2016

OTHER PUBLICATIONS

Micro Jack Screw Precision Board Stacking Standoff, VITA and PC/104 Standard, Samtec, printed Dec. 9, 2019 https://www.samtec.com/products/jsom, 1 page.
(Continued)

*Primary Examiner* — Alexander Gilman
(74) *Attorney, Agent, or Firm* — Suiter Swantz pc llo

(57) ABSTRACT

A circuit board separation mechanism may include a separation block positioned within a separation block cut-out of a heatsink. The heatsink may be positioned between a first circuit board including a first component of at least one connector and a second circuit board including a second component of the at least one connector. The circuit board separation mechanism may include a set screw inserted in the separation block. A portion of the set screw may be configured to engage a surface of the heatsink. The separation block may be configured to lift against a surface of the first circuit board when the set screw is rotated. The first component of the at least one connector and the second component of the at least one connector may be configured to separate when the set screw is rotated and the separation block lifts against the surface of the first circuit board.

14 Claims, 10 Drawing Sheets

(51) Int. Cl.
  *H05K 1/02* (2006.01)
  *H05K 1/18* (2006.01)
  *H05K 1/14* (2006.01)
  *H05K 7/20* (2006.01)

(56) References Cited

U.S. PATENT DOCUMENTS

| | | | | |
|---|---|---|---|---|
| 5,785,449 | A * | 7/1998 | DiBene | F16B 41/002 |
| | | | | 403/343 |
| 5,847,927 | A * | 12/1998 | Minning | F28F 13/003 |
| | | | | 361/696 |
| 5,903,439 | A * | 5/1999 | Tamarkin | H05K 7/1451 |
| | | | | 361/742 |
| 5,984,688 | A * | 11/1999 | Norris | G06F 1/183 |
| | | | | 361/756 |
| 6,181,561 | B1 * | 1/2001 | Albrecht | H05K 7/142 |
| | | | | 29/845 |
| 6,353,264 | B1 * | 3/2002 | Coronel | G02B 6/43 |
| | | | | 257/432 |
| 6,353,538 | B1 * | 3/2002 | Ali | H01L 23/3675 |
| | | | | 174/252 |
| 6,362,974 | B1 * | 3/2002 | Lettang | H05K 7/1459 |
| | | | | 361/790 |
| 6,392,890 | B1 * | 5/2002 | Katchmar | H05K 7/20463 |
| | | | | 174/252 |
| 6,449,156 | B1 * | 9/2002 | Han | G11C 5/04 |
| | | | | 361/704 |
| 6,498,730 | B2 * | 12/2002 | Centola | H05K 7/1407 |
| | | | | 361/756 |
| 7,061,126 | B2 * | 6/2006 | Meyer | H05K 3/301 |
| | | | | 257/730 |
| 7,113,406 | B1 * | 9/2006 | Nguyen | H01L 23/4006 |
| | | | | 165/185 |
| 7,176,707 | B1 * | 2/2007 | Hokenson | H05K 3/0061 |
| | | | | 257/E23.102 |
| 7,180,751 | B1 * | 2/2007 | Geschke | H01R 13/6658 |
| | | | | 361/758 |
| 7,254,036 | B2 * | 8/2007 | Pauley | H05K 1/0203 |
| | | | | 165/80.2 |
| 7,468,889 | B2 * | 12/2008 | Su | H01L 23/4006 |
| | | | | 165/80.2 |
| 7,518,862 | B1 * | 4/2009 | Macika | G06F 1/20 |
| | | | | 361/688 |
| 7,606,030 | B2 * | 10/2009 | Zhou | H01L 23/4006 |
| | | | | 165/104.33 |
| 7,768,785 | B2 * | 8/2010 | Ni | H01L 23/42 |
| | | | | 361/715 |
| 7,835,153 | B2 * | 11/2010 | Kearns | H01L 23/40 |
| | | | | 361/719 |
| 8,027,164 | B2 * | 9/2011 | Peck | H05K 7/142 |
| | | | | 361/730 |
| 8,366,464 | B1 | 2/2013 | Figuerado et al. | |
| 8,439,615 | B2 * | 5/2013 | Wu | H05K 7/1407 |
| | | | | 411/107 |
| 8,545,258 | B1 * | 10/2013 | Grice | H01L 23/4006 |
| | | | | 439/487 |
| 9,379,039 | B2 * | 6/2016 | Lam | H01L 23/4006 |
| 9,408,328 | B2 * | 8/2016 | Nigen | H05K 7/20436 |
| 9,980,365 | B1 * | 5/2018 | Chen | H05K 1/18 |
| 10,764,990 | B1 * | 9/2020 | Chen | H05K 1/021 |
| 10,840,644 | B1 | 11/2020 | Tokito | |
| 10,879,840 | B2 * | 12/2020 | Sella | H05K 9/0015 |
| 2001/0055198 | A1 * | 12/2001 | Park | H01L 23/4006 |
| | | | | 361/700 |
| 2004/0070944 | A1 | 4/2004 | Wells et al. | |
| 2005/0067178 | A1 * | 3/2005 | Pearson | H01L 23/10 |
| | | | | 174/548 |
| 2005/0072558 | A1 * | 4/2005 | Whitney | H01L 23/4006 |
| | | | | 165/80.3 |
| 2005/0078455 | A1 * | 4/2005 | MacGregor | H01L 23/4006 |
| | | | | 361/719 |
| 2005/0108877 | A1 * | 5/2005 | Peterson | B23P 11/00 |
| | | | | 29/890.03 |
| 2005/0248024 | A1 * | 11/2005 | Costello | H05K 7/1092 |
| | | | | 257/691 |
| 2006/0221590 | A1 * | 10/2006 | Campini | G06F 1/185 |
| | | | | 361/803 |
| 2006/0262506 | A1 * | 11/2006 | Lee | H01L 23/4006 |
| | | | | 361/703 |
| 2006/0275100 | A1 * | 12/2006 | Aukzemas | F16B 37/145 |
| | | | | 411/353 |
| 2007/0112988 | A1 | 5/2007 | Yang et al. | |
| 2007/0294433 | A1 * | 12/2007 | Leigh | G06F 13/4221 |
| | | | | 709/250 |
| 2009/0205197 | A1 * | 8/2009 | Kreissig | H01L 23/4006 |
| | | | | 29/739 |
| 2013/0031288 | A1 * | 1/2013 | Richard | G06F 13/4022 |
| | | | | 710/301 |
| 2013/0044436 | A1 * | 2/2013 | Kovatchev | H05K 1/0218 |
| | | | | 361/720 |
| 2013/0250523 | A1 * | 9/2013 | Lai | H01L 23/4093 |
| | | | | 361/720 |
| 2014/0043753 | A1 * | 2/2014 | Kaplun | G06F 1/185 |
| | | | | 361/679.54 |
| 2014/0365698 | A1 * | 12/2014 | Richard | G06F 13/4022 |
| | | | | 710/300 |
| 2015/0084182 | A1 * | 3/2015 | De Cecco | H01L 23/42 |
| | | | | 257/720 |
| 2017/0162966 | A1 * | 6/2017 | Vanderveen | H05K 1/14 |
| 2017/0196075 | A1 * | 7/2017 | Barron | H01L 23/40 |
| 2018/0160524 | A1 | 6/2018 | Barron et al. | |
| 2019/0269005 | A1 * | 8/2019 | He | F28F 3/02 |

OTHER PUBLICATIONS

Extended Search Report for European Application No. 21154953.0 dated Jun. 18, 2021, 6 pages.

* cited by examiner

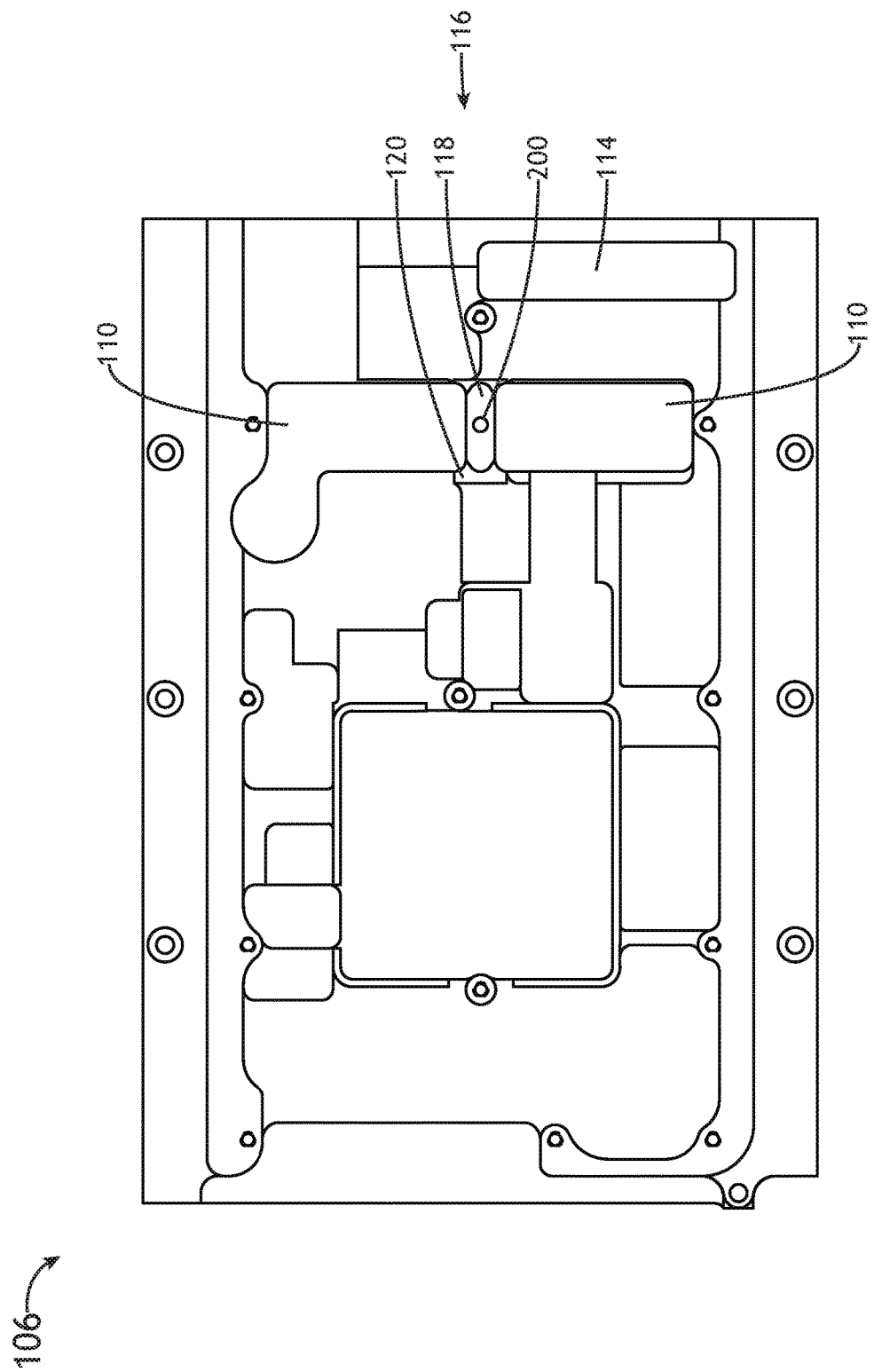

CIRCUIT BOARD SEPARATION MECHANISM

BACKGROUND

Due to avionics industry standards and/or guidelines, select avionics module assemblies may require the implementation of specific Circuit Card Assembly (CCA) designs. For example, the select avionics module assemblies may require specific Switch Mezzanine Card (XMC) and Peripheral Component Interconnect (PCI) Mezzanine Card (PMC) connector designs including one or more high-density connectors, which may require a de-mating force that may be difficult to apply in a controlled manner when separating a base card and a mezzanine card in the avionics module assembly. By way of another example, the select avionics module assemblies may include specific cooling components necessary to counter potentially extreme thermal environments. The specific cooling components may further increase the difficulty in applying the de-mating force in a controlled manner when separating the base card and the mezzanine card in the avionics module assembly.

SUMMARY

A circuit board separation mechanism is disclosed, in accordance with one or more embodiments of the disclosure. The circuit board separation mechanism may include a separation block positioned within a separation block cut-out of a heatsink. The heatsink may be positioned between a first circuit board including a first component of at least one connector and a second circuit board including a second component of the at least one connector. The circuit board separation mechanism may include a set screw inserted in the separation block. At least a portion of the set screw may be configured to engage a surface of the heatsink. The separation block may be configured to lift against a surface of the first circuit board when the set screw is rotated. The first component of the at least one connector and the second component of the at least one connector may be configured to separate when the set screw is rotated and the separation block lifts against the surface of the first circuit board.

In some embodiments, the set screw may be configured to engage a set screw groove in the surface of the heatsink.

In some embodiments, the set screw may be tightened against the set screw groove when rotated.

In some embodiments, the set screw may be accessed via a primary channel within the separation block. The primary channel may be accessed via a primary opening in a surface of the separation block. The primary opening may be accessed via an opening within the second circuit board.

In some embodiments, the separation block may include at least one keyed section configured to mate with at least one corresponding groove within the separation block cut-out of the heatsink.

In some embodiments, the circuit board separation mechanism may include at least one actuation inhibitor. The at least one actuation inhibitor may be inserted in an auxiliary channel via an auxiliary opening in a surface of the separation block.

In some embodiments, the at least one actuation inhibitor may be inserted in at least one actuation inhibitor cut-out in the heatsink. The at least one actuation inhibitor cut-out may be accessible via the auxiliary channel.

In some embodiments, the at least one actuation inhibitor may be configured to engage a surface in the auxiliary channel when the set screw rotates, the separation block lifts against the surface of the first circuit board, and a selected amount of actuation occurs. The engaging of the surface in the auxiliary channel may prevent actuation of the separation block beyond the selected amount of actuation.

In some embodiments, the at least one connector may include at least one Switch Mezzanine Card (XMC) connector.

In some embodiments, the heatsink may include at least one XMC opening configured to receive the at least one XMC connector when the at least one XMC connector is mated.

In some embodiments, the at least one XMC connector may include two XMC connectors. The at least one XMC opening may include two XMC openings. The separation block cut-out may be positioned in the heatsink between the two XMC openings.

In some embodiments, the at least one connector may include at least one Peripheral Component Interconnect (PCI) Mezzanine Card (PMC) connector.

In some embodiments, the heatsink may include at least one PMC opening configured to receive the at least one PMC connector when the at least one PMC connector is mated.

In some embodiments, the first circuit board may include a mezzanine card. The second circuit board may include a base card.

An avionics module assembly is disclosed, in accordance with one or more embodiments of the disclosure. The avionics module assembly may include a first circuit board including a first component of at least one connector. The avionics module assembly may include a second circuit board including a second component of the at least one connector. The avionics module assembly may include a heatsink positioned between the first circuit board and the second circuit board. The avionics module assembly may include a circuit board separation mechanism. The circuit board separation mechanism may include a separation block positioned in a separation block cut-out of the heatsink. The circuit board separation mechanism may include a set screw inserted within the separation block cut-out. At least a portion of the set screw may be configured to engage a surface of the heatsink. The separation block may be configured to lift against a surface of the first circuit board when the set screw is rotated. The first component of the at least one connector and the second component of the at least one connector may be configured to separate when the set screw is rotated and the separation block lifts against the surface of the first circuit board.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are examples and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

FIG. 3A illustrates a plan view of a heatsink of an avionics module assembly including a circuit board separation mechanism, in accordance with one or more embodiments of the disclosure;

DETAILED DESCRIPTION OF THE INVENTION

Figure 1:
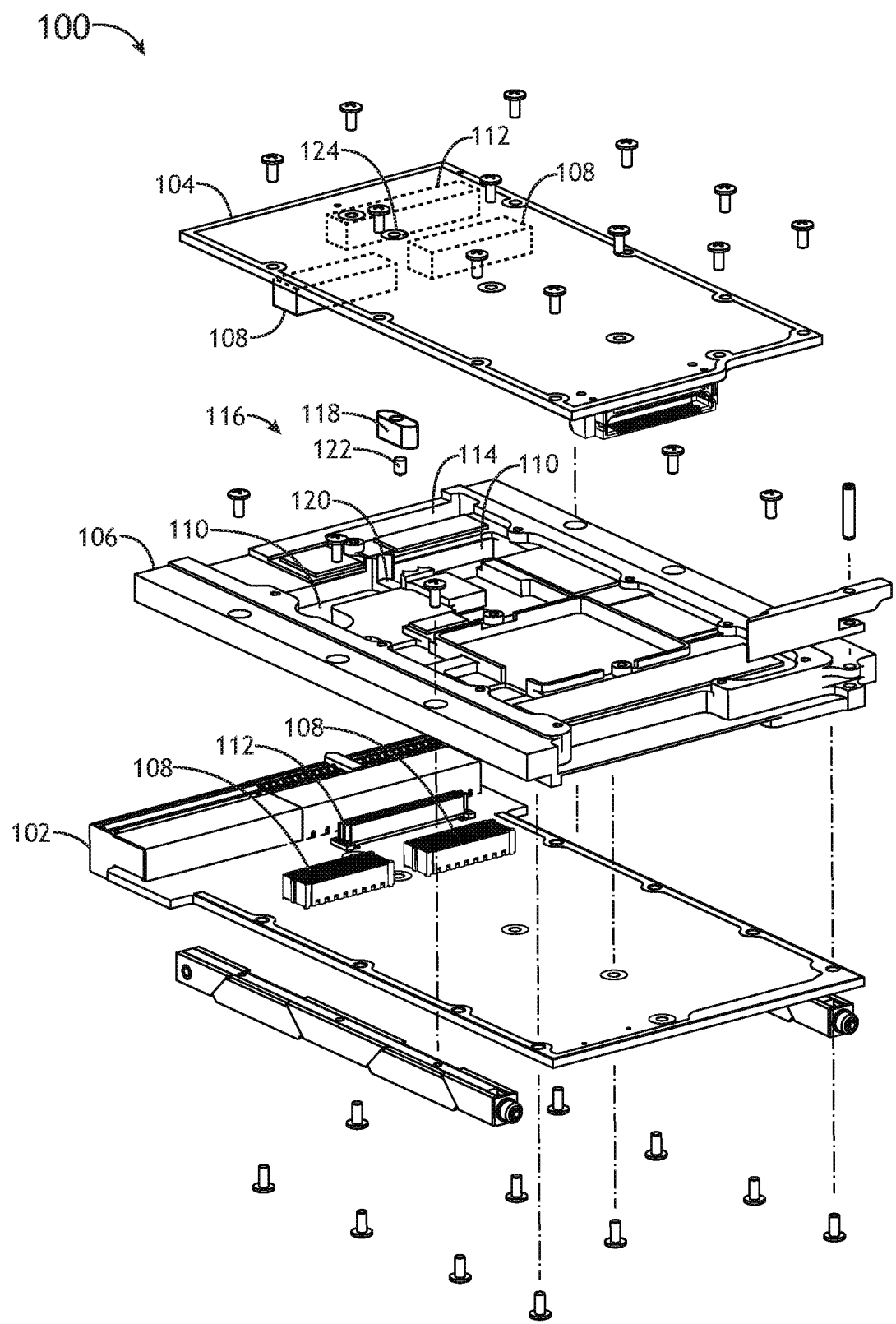
FIG. 1 illustrates an exploded perspective view of an avionics module assembly including a circuit board separation mechanism, in accordance with one or more embodiments of the disclosure.

Reference will now be made in detail to the subject matter disclosed, which is illustrated in the accompanying drawings.

Before explaining one or more embodiments of the disclosure in detail, it is to be understood the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination of sub-combination of two or more such features, along with any other features which may not necessarily be expressly described or inherently present in the instant disclosure.

FIGS. 1-6B generally illustrate a circuit board separation mechanism, in accordance with one or more embodiments of the disclosure.

Select avionics module assemblies may require the implementation of specific Circuit Card Assembly (CCA) designs due to avionics industry standards and/or guidelines, which may require a specific selection of parts, placement of the parts, and routing to/from the parts. For example, the standards and/or guidelines may be set forth by the VMEbus International Trade Association (VITA). For instance, the standards and/or guidelines may include, but are not limited to, VITA 42.0, VITA 46.0, and VITA 48.2.

The select avionics module assemblies may require specific Switch Mezzanine Card (XMC) and Peripheral Component Interconnect (PCI) Mezzanine Card (PMC) connector designs, including one or more high-density connectors, in the VITA 3U and 6U-style module assemblies. For example, being a compliant VITA avionics module assembly may require placements of up to two XMC connectors and up to four PMC connectors in an avionics module assembly including a single base card and a single mezzanine card. The XMC and/or PMC connector designs may require a de-mating force that may be difficult to apply in a controlled manner, while attempting to ensure the protection of delicate connector interfaces, when separating a base card and a mezzanine card in the avionics module assembly.

The select avionics module assemblies may include specific cooling components necessary to counter potentially extreme thermal environments. For example, the standards and/or guidelines (e.g., set forth by VITA, set forth by purchasing customers, or set forth in other capacities) may require conduction cooling of the VITA 3U and 6U-style module assemblies. For instance, a heatsink may be incorporated between opposing faces of the base card and the mezzanine card to form the module assembly. The arrangement of the specific cooling components may further increase the difficulty in applying the de-mating force in a controlled manner when separating the base card and the mezzanine card in the avionics module assembly, as the specific cooling components may obstruct access to the delicate connector interfaces (e.g., in the event of needing to break down the avionics module assembly for rework or test).

As such, it would be beneficial to provide a circuit board separation mechanism capable of uncoupling the various components of the avionics module assembly. The circuit board separation mechanism should allow for a better application of force without providing additional stress or strain on the delicate connector interfaces.

FIGS. 1-6B generally illustrate an avionics module assembly 100, in accordance with one or more embodiments of the disclosure.

The avionics module assembly 100 may include a circuit board 102. For example, the circuit board 102 may include, but is not limited to, a base card 102. The avionics module assembly 100 may include a circuit board 104. For example, the circuit board 104 may include, but is not limited to, a mezzanine card 104. The avionics module assembly 100 may include a heatsink 106. The heatsink 106 may be positioned between the circuit board 102 (e.g., the base card 102) and the circuit board 104 (e.g., the mezzanine card 104) within the avionics module assembly 100.

The avionics module assembly 100 may include one or more connectors 108. For example, the one or more connectors 108 may include, but are not limited to, one or more Switch Mezzanine Card (XMC) connectors 108. For example, one component of an XMC connector 108 (e.g., a set of pins, a set of pin sockets, or the like) may be installed on the base card 102, and a mating component of the XMC connector 108 (e.g., a corresponding set of pin sockets, a corresponding set of pins, or the like) may be installed on the mezzanine card 104. The heatsink 106 may include one or more XMC openings 110. For example, the components of the one or more XMC connectors 108 may be configured to mate within an XMC opening 110 when the avionics module assembly 100 is assembled.

The avionics module assembly 100 may include one or more connectors 112. For example, the one or more connectors 112 may include, but are not limited to, one or more Peripheral Component Interconnect (PCI) Mezzanine Card (PMC) connectors 112. For example, one component of a PMC connector 112 (e.g., a set of pins, a set of pin sockets, or the like) may be installed on the base card 102, and a mating component of the PMC connector 112 (e.g., a corresponding set of pin sockets, a corresponding set of pins, or the like) may be installed on the mezzanine card 104. The heatsink 106 may include one or more PMC openings 114. For example, the components of the one or more PMC connectors 112 may be configured to mate within a PMC opening 114 when the avionics module assembly 100 is assembled.

The avionics module assembly 100 may include a circuit board separation mechanism 116. The circuit board separation mechanism 116 may include a separation block 118. The separation block 118 may be configured to set within a separation block cut-out 120 of the heatsink 106. For example, where there are multiple XMC openings 110, the separation block cut-out 120 may be positioned between the multiple XMC openings 110. By way of another example, where there are multiple PMC openings 114, the separation block cut-out 120 may be positioned between the multiple PMC openings 114. By way of another example, the separation block cut-out 120 may be positioned between an XMC opening 110 and a PMC opening 114. In general, the separation block cut-out 120 may be positioned in a centered or substantially centered location within the avionics module assembly 100, to allow for as even a distribution of a force applied to components of the avionics module assembly 100 via the circuit board separation mechanism 116 as possible.

The separation block cut-out 120 may not pass through the heatsink 106, as opposed to the one or more XMC openings 110 and/or the one or more PMC openings 114 which may need to pass through the heatsink 106 in order to allow the one or more XMC connectors 108 and/or the one or more PMC connectors 112, respectively, to mate. It is noted herein, however, the separation block cut-out 120 may pass through the heatsink 106 where the design of the various components of the avionics module assembly 100 still allow for the separation block cut-out 120 to interact with (e.g., push against or lift) another component of the avionics module assembly 100 (e.g., the circuit board 102, the circuit board 104, the heatsink 106, or the like).

Figure 2A:
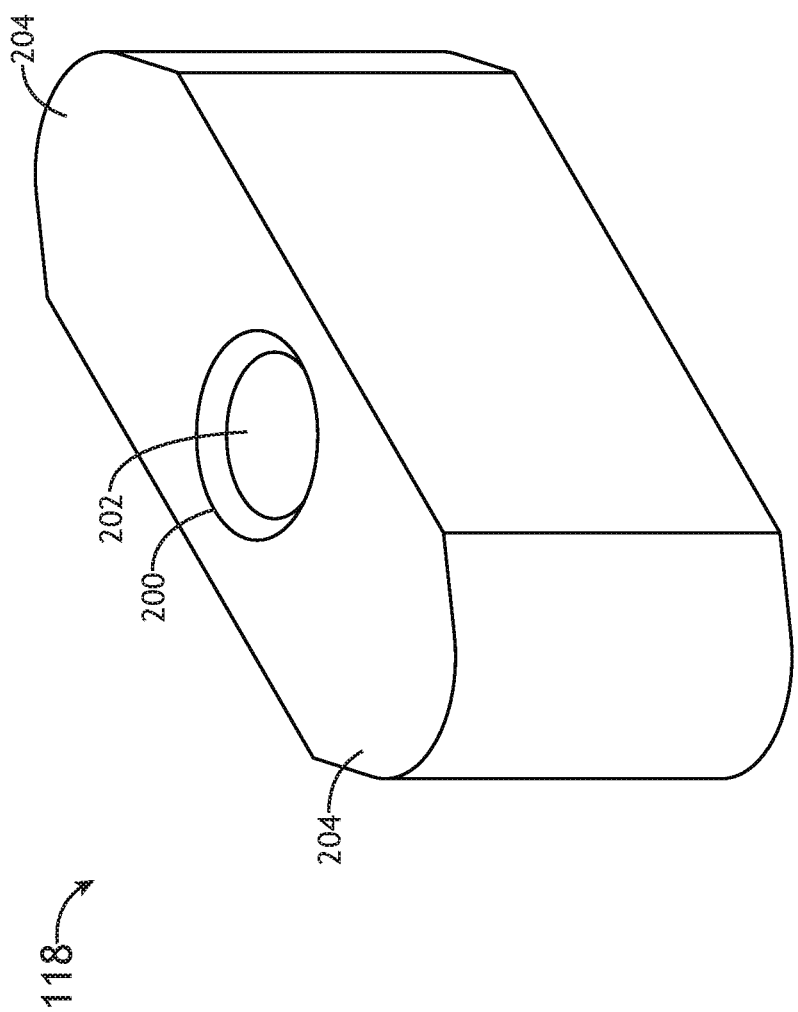
FIG. 2A illustrates a perspective view of a separation block of a circuit board separation mechanism, in accordance with one or more embodiments of the disclosure.
Figure 2B:
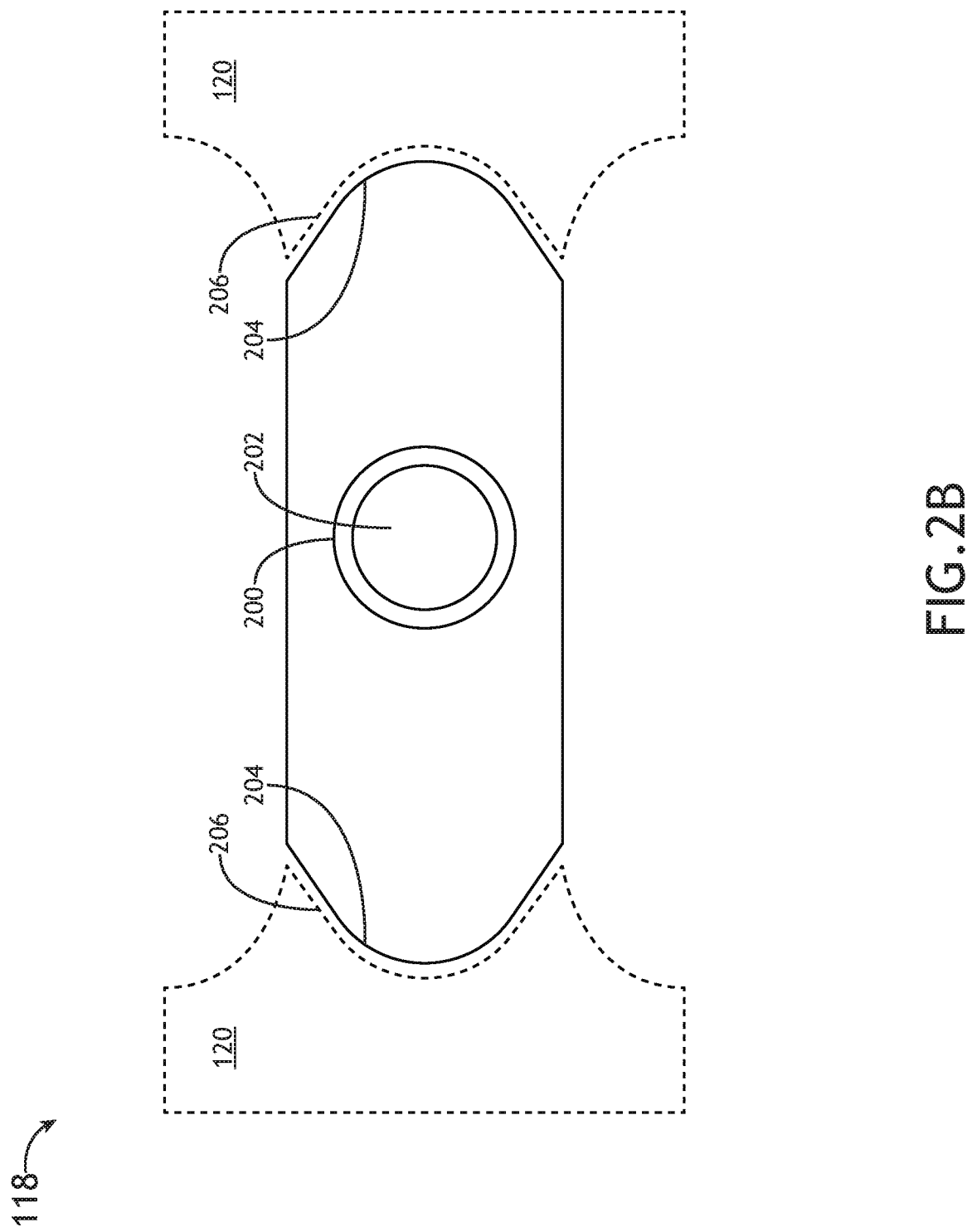
FIG. 2B illustrates a plan view of a separation block of a circuit board separation mechanism, in accordance with one or more embodiments of the disclosure.

As illustrated in at least FIGS. 2A and 2B, a surface of the separation block 118 may include a primary opening 200. The primary opening 200 may lead to a primary channel 202 through the separation block 118. For example, the primary channel 202 may be threaded. The separation block 118 may include one or more keyed sections or protrusions 204 configured to mate with one or more corresponding grooves 206 of the separation block cut-out 120 when the separation block 118 is installed within the heatsink 106. For example, the mating between the one or more keyed sections or protrusions 204 and the one or more corresponding grooves 206 may prevent the separation block 118 from moving (e.g., translating, rotating, or the like) within the avionics module assembly 100.

Figure 3B:
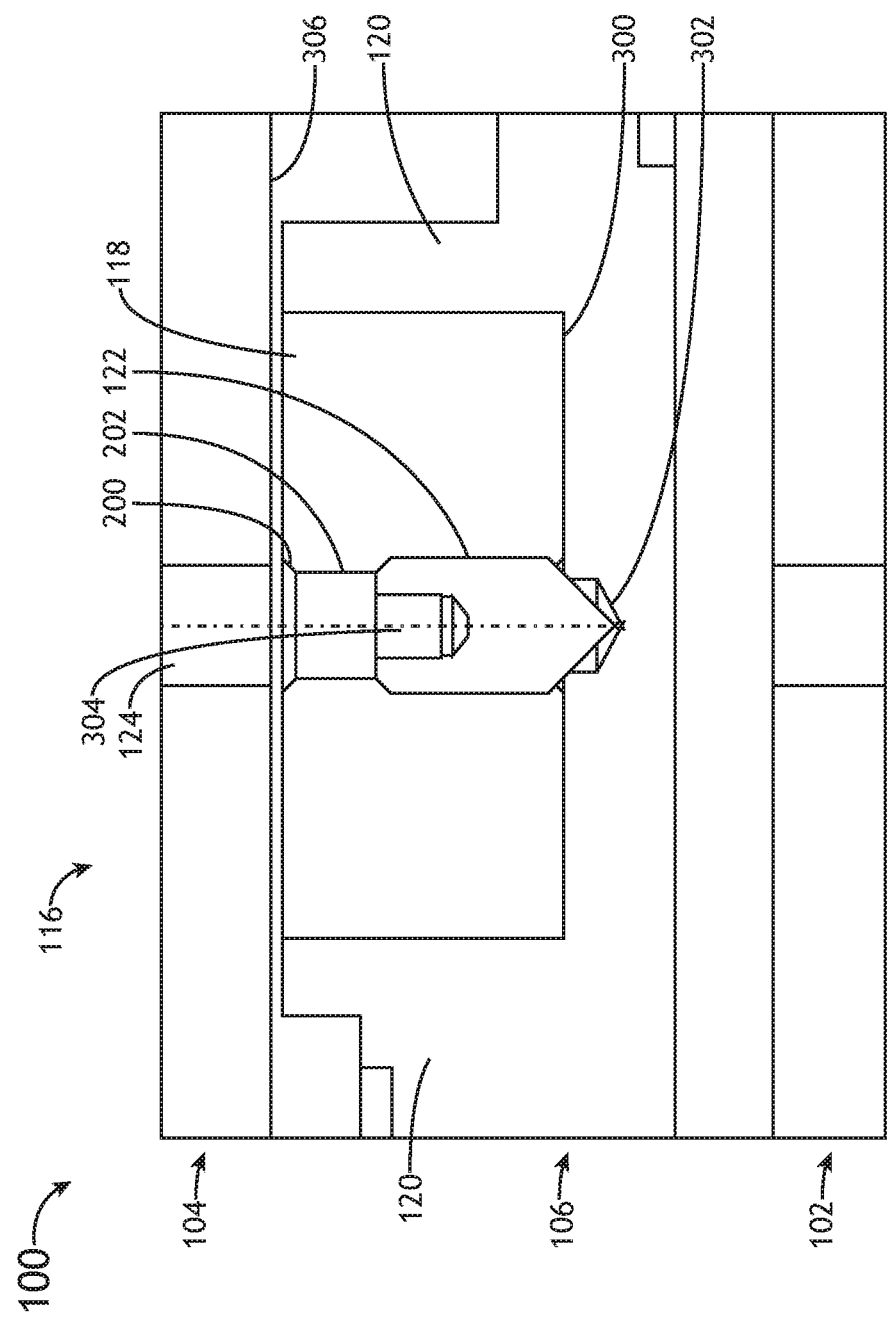
FIG. 3B illustrates an elevation view of an avionics module assembly including a circuit board separation mechanism, in accordance with one or more embodiments of the disclosure.

As illustrated in at least FIGS. 3A and 3B, the circuit board separation mechanism 116 may include a set screw 122. The set screw 122 may be set within the separation block cut-out 120 of the heatsink 106. The separation block 118 may be inserted within the separation block cut-out 120, such that the set screw 122 is pinned between the separation block 118 and a surface 300 of the heatsink 106. For example, the surface 300 may be a bottom or lower surface of the separation block cut-out 120.

The set screw 122 may mate with the primary channel 202. For example, where the primary channel 202 is threaded, the set screw 122 may include a corresponding threading. The set screw 122 (and the primary channel 202 of the separation block 118) may be aligned with an opening 124 within the mezzanine card 104. For example, the opening 124 may be a standard mounting opening in the mezzanine card 104. By way of another example, the opening 124 may be custom-cut in the mezzanine card 104.

At least a portion of the set screw 122 may be configured to engage the surface 300 of the heatsink 106. For example, at least a portion of the set screw 122 may be configured to engage a set screw groove 302 within the surface 300 of the heatsink 106. For instance, at least a portion of the set screw 122 may push against a surface in the set screw groove 302 of the heatsink 106 when the set screw 122 is rotated (e.g., tightened), which may cause the separation block 118 to lift.

The set screw 122 may be rotated in a first direction or a second direction via a tool interacting with a tool cut-out 304 of the set screw 122, the tool cut-out 304 accessible via the opening 124 of the mezzanine card 104 and the primary opening 200/primary channel 202 of the separation block 118.

The separation block 118 may be configured to engage with a surface 306 of the mezzanine card 104. For example, the surface 300 may be a bottom or lower surface of the mezzanine card 104. The separation block 118 may push against the surface 306 of the mezzanine card 104 when the set screw 122 is rotated in the first direction, where pushing against the surface 300 of the heatsink 106 may cause the mezzanine card 104 to lift. By way of another example, the avionics module assembly 100 may be assembled (e.g., the one or more XMC connectors 108 and/or the one or more PMC connectors 112 may mate) when the set screw 122 is rotated in the second direction, as the separation block 118 may be pulled within the separation block cut-out 120.

In this regard, the circuit board separation mechanism 116 may implement a mechanical advantage of the set screw 122 threads (e.g., similar to a jack screw) to lift the separation block 118 and the mezzanine card 104 via a controlled motion from the heatsink 106. This controlled motion may cause the components of the one or more XMC connectors 108 and/or the components of the one or more PMC connectors 112 to separate in a particular direction, allowing the mezzanine card 104 to separate from the base card 102 without damage (e.g., damage to connector pins and/or pin sockets caused by an uneven motion and/or a twisting motion, which may be generated if disassembled via a force applied by hands).

Although embodiments of the disclosure illustrate the heatsink 106 as including the separation block cut-out 120, it is noted herein the heatsink 106 may instead be configured to receive a bracket (e.g., held in place via friction, interference, one or more fasteners, an adhesive, or the like), where the bracket is configured to engage with the separation block 118. Therefore, the above description should not be interpreted as a limitation on the present disclosure but merely an illustration.

Figure 4:
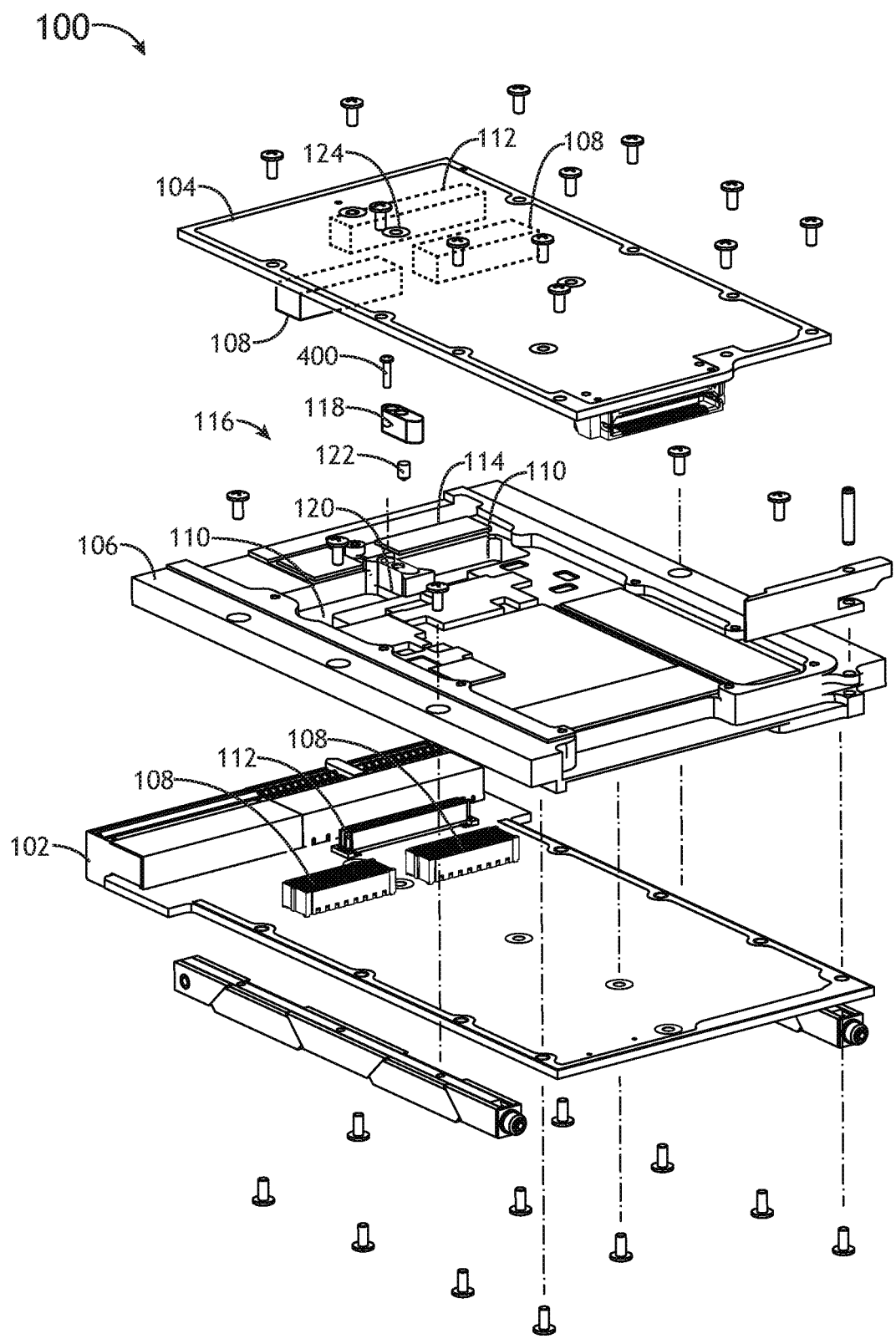
FIG. 4 illustrates an exploded perspective view of an avionics module assembly including a circuit board separation mechanism, in accordance with one or more embodiments of the disclosure.
Figure 6A:
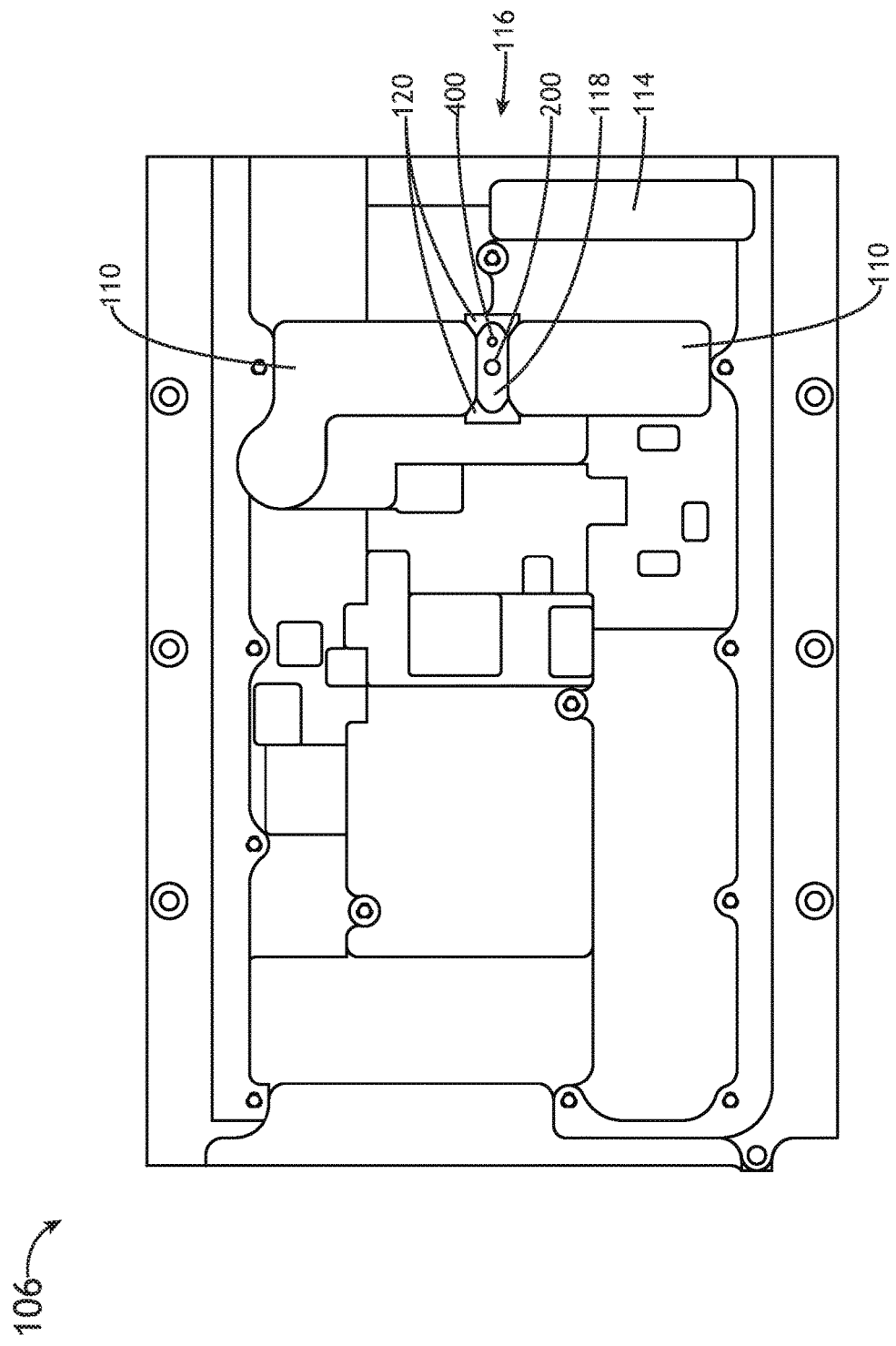
FIG. 6A illustrates a plan view of a heatsink of an avionics module assembly including a circuit board separation mechanism, in accordance with one or more embodiments of the disclosure.

As illustrated at least FIGS. 4 and 6A, the circuit board separation mechanism 116 may include one or more actuation inhibitors 400. For example, at least a portion of the one or more actuation inhibitors 400 may be threaded. The one or more actuation inhibitors 400 may be insertable within the separation block 118. The one or more actuation inhibitors 400 may prevent actuation of the separation block 118 beyond a selected amount (e.g., distance of travel, angle of rotation, or the like) of actuation. For example, the one or more actuation inhibitors 400 may prevent actuation of the separation block 118 beyond a selected amount of actuation caused by the set screw 122 being rotated in the first direction and the separation block 118 (along with the heatsink 106 and the mezzanine card 104) being lifted from the heatsink 106.

Figure 5A:
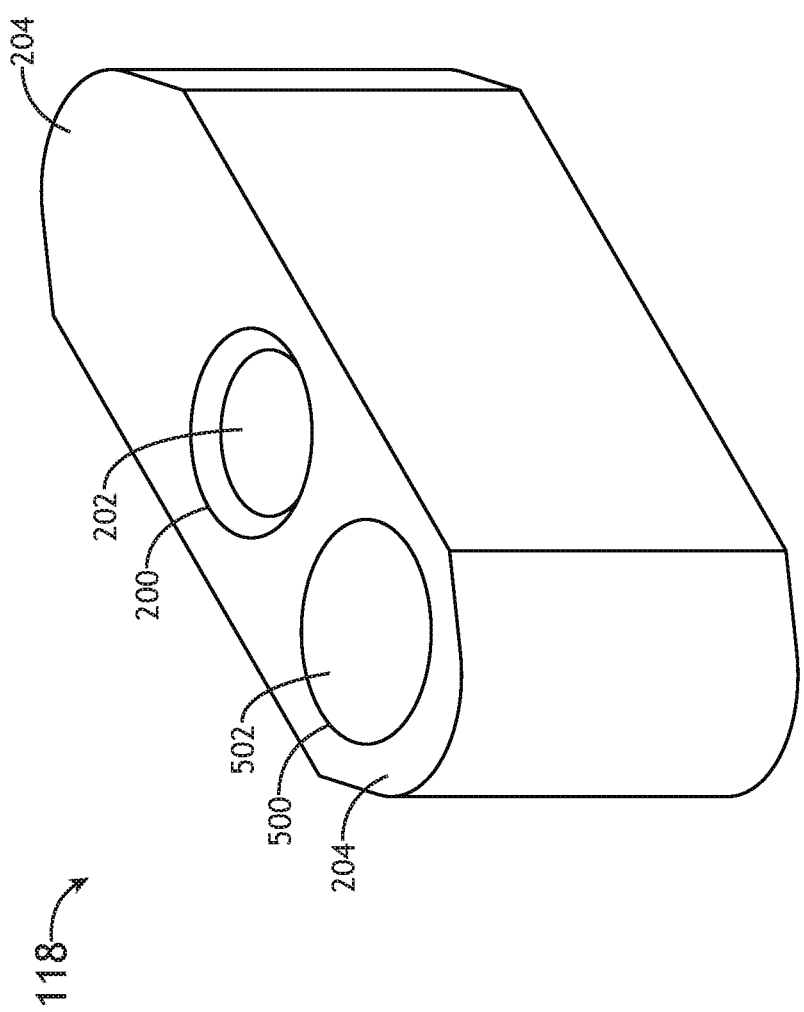
FIG. 5A illustrates a perspective view of a separation block of a circuit board separation mechanism, in accordance with one or more embodiments of the disclosure.
Figure 5B:
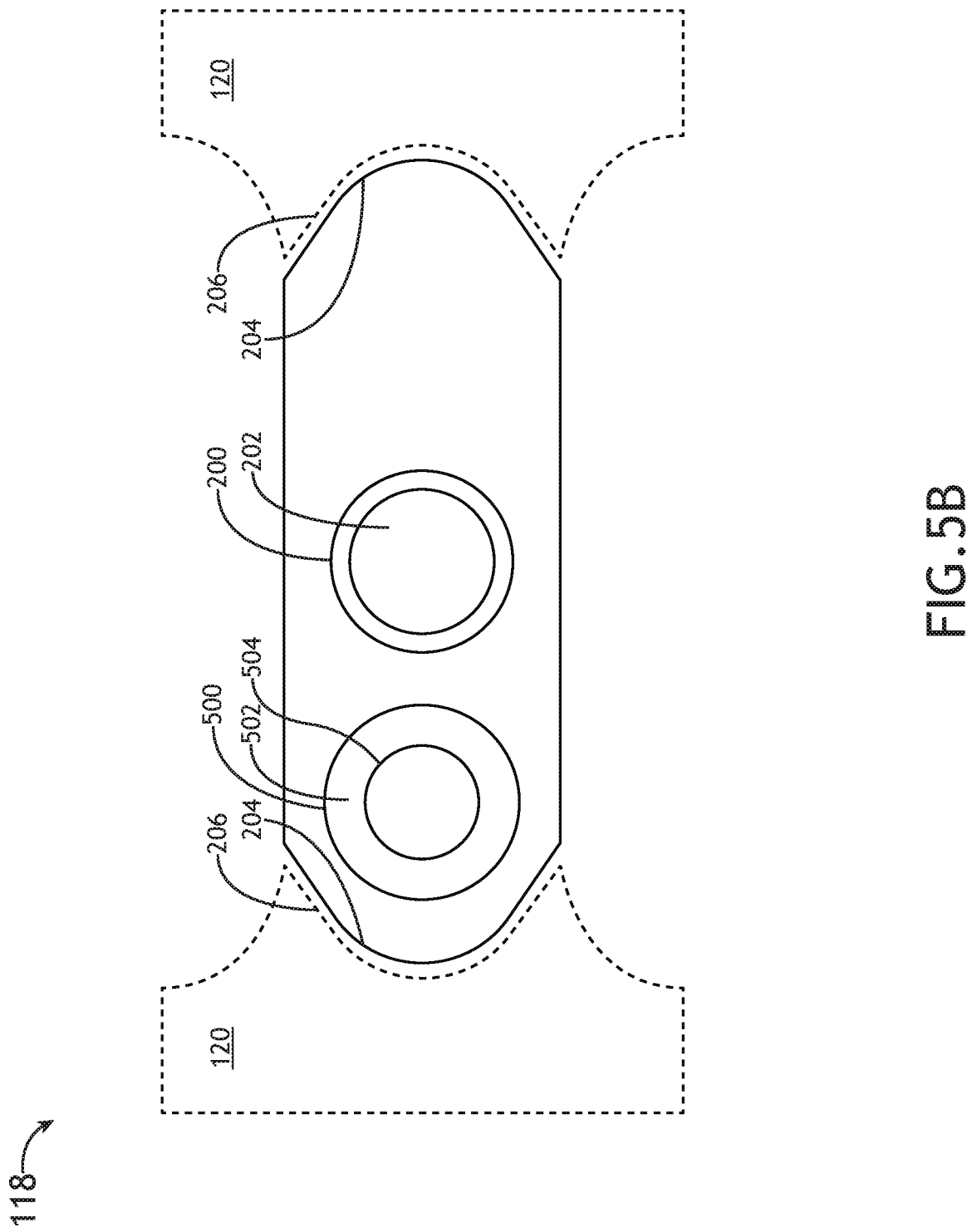
FIG. 5B illustrates a plan view of a separation block of a circuit board separation mechanism, in accordance with one or more embodiments of the disclosure.

As illustrated in FIGS. 5A and 5B, a surface of the separation block 118 may include an auxiliary opening 500. For example, the surface including the auxiliary opening 500 may be the same surface including the primary opening 200. It is noted herein, however, that the primary opening 200 and the auxiliary opening 500 may be within different surfaces of the separation block 118. The auxiliary opening 500 may lead to an auxiliary channel 502 through the separation block 118. The auxiliary channel 502 may be counter-bored through the separation block 118.

The auxiliary channel 502 may include one or more sections configured to receive an actuation inhibitor 400. For example, the auxiliary channel 502 may include a first section having a first width and a second section having a second width. Where the auxiliary channel 502 includes multiple widths, the auxiliary channel 502 may include a surface 504 at least partially inset within the body of the separation block 118.

Figure 6B:
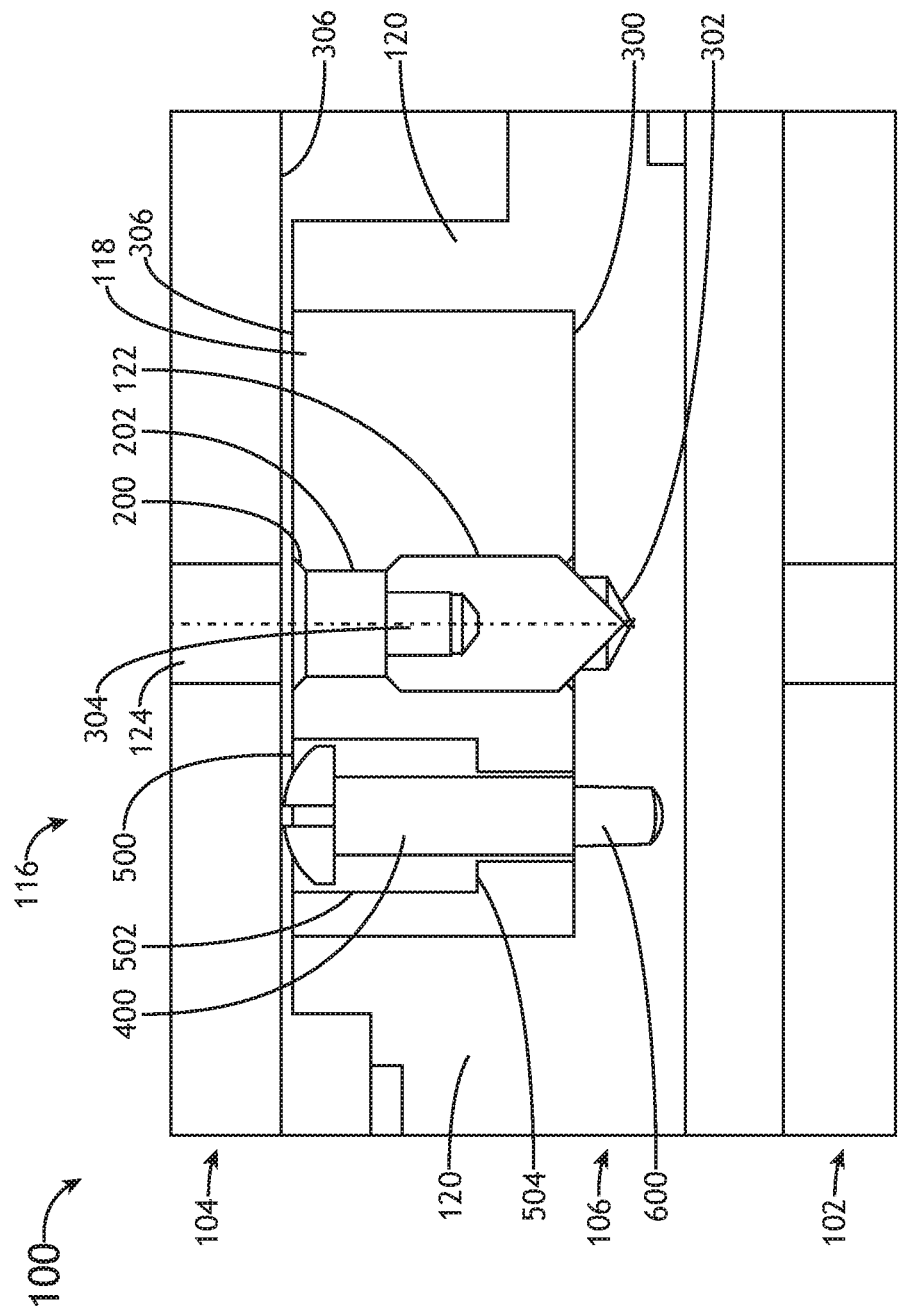
FIG. 6B illustrates an elevation view of an avionics module assembly including a circuit board separation mechanism, in accordance with one or more embodiments of the disclosure.

As illustrated in at least FIG. 6B, the one or more actuation inhibitors 400 may be inserted within one or more corresponding actuation inhibitor cut-outs 600 within the heatsink 106 via the corresponding one or more auxiliary openings 500/channels 502. For example, where at least a portion of the one or more actuation inhibitors 400 are threaded, the corresponding one or more actuation inhibitor cut-outs 600 may be threaded. In general, the one or more actuation inhibitors 400 may include any device configured to be insertable within the one or more actuation inhibitor cut-outs 600 of the heatsink 106 and configured to engage with the surface 504 of the separation block 118. For example, the one or more actuation inhibitors 400 may include, but are not limited to, one or more fasteners. For instance, the one or more fasteners may include, but are not limited to, a panhead screw with a flat or substantially flat under-head surface configured to engage with the surface 504 of the separation block 118.

The one or more actuation inhibitors 400 engaging with the surface 504 of the separation block 118 may prevent the separation block 118 from fully separating from the heatsink 106 when the set screw 122 is rotated in the first direction. For example, the motion of the separation block 118 may be limited to a length of at least a portion of the auxiliary channel 502. For instance, the length of the at least the portion of the auxiliary channel 502 may be enough to allow for complete separation of the components of the one or more XMC connectors 108 and/or the components of the one or more PMC connectors 112. In addition, the length of the at least the portion of the auxiliary channel 502 may be enough to allow a user to more fully grasp onto the base card 102 and/or the mezzanine card 104, to lessen the possibility of an incorrect application of force when disassembling the avionics module assembly 100. In this regard, the one or more actuation inhibitors 400 may limit the overall motion of the separation block 118 to prevent the separation block 118 from being misplaced (e.g., via removal from the heatsink 106) when the base card 102 and the mezzanine card 104 are separated from the heatsink 106.

In this regard, the circuit board separation mechanism 116 may allow for controlled separation (e.g., in terms of applied force and/or selected timing to separate) of the base card 102 and the mezzanine card 104 of the avionics module assembly 100. The controlled separation may be accomplished through a lifting force instead of more a complex mechanism including pushbuttons, push-pull mechanisms, springs, or other additional actuating or actuatable components. The lifting force may be applied at a single point in the avionics module assembly 100 as opposed to at multiple points within the avionics module assembly 100.

Due to the interaction of the separation block 118 and the separation block cut-out 120, the motion of separation may be in a direction that protects the pins and/or pin sockets of the one or more XMC connectors 108 and/or the one or more PMC connectors 112 from damage when the base card 102 and the mezzanine card 104 are separated. For example, an uneven motion and/or a twisting motion applied to the components of the one or more XMC connectors 108 on their respective base card 102 or mezzanine card 104 relative to one another, which may occur when disassembling by hand, may be prevented via the application of the lifting force by tightening the set screw 122. By way of another example, an uneven motion and/or a twisting motion applied to the components of the one or more XMC connectors 108 on their respective base card 102 or mezzanine card 104 relative to one another, which may occur when disassembling by hand, may be prevented via the application of the lifting force by tightening the set screw 122.

Although embodiments of the disclosure discuss conforming to standards and/or guidelines set forth by VITA, it is noted herein the circuit board separation mechanism 116 may need to be configured (e.g., in addition to or in the alternative to VITA) in accordance with aviation guidelines and/or standards put forth by, but not limited to, the Federal Aviation Administration (FAA), the European Aviation Safety Agency (EASA) or any other flight certification agency or organization; the American National Standards Institute (ANSI), Aeronautical Radio, Incorporated (ARINC), or any other standards setting organization or company; the Radio Technical Commission for Aeronautics (RTCA) or any other guidelines agency or organization; or the like. Therefore, the above description should not be interpreted as a limitation on the present disclosure but merely an illustration.

Although the present disclosure is directed to the avionics module assembly 100 including the circuit board separation mechanism 116, it is noted herein the circuit board separation mechanism 116 may be implemented in any assembly (e.g., including, but not limited to, a set of circuit cards) requiring a separation of components of a connector (e.g., an electrical connector, a mechanical connector, or other connector known in the art), where the connector is located in close working quarters and/or requires an application of a force in a particular direction or set of directions to prevent damage of the components of the connector.

The assembly may not be limited to an avionics environment and/or to aircraft components within the avionics environment, and instead may be installed within any number of environments. For example, the environment may include any type of vehicle known in the art. For instance, the vehicle may be any air, space, land, or water-based personal equipment or vehicle; any air, space, land, or water-based commercial equipment or vehicle; any air, space, land, or water-based military equipment or vehicle known in the art. By way of another example, the environment may include a commercial or industrial establishment (e.g., a home or a business).

Although the disclosure has been described with reference to the embodiments illustrated in the attached drawing figures, equivalents may be employed and substitutions made herein without departing from the scope of the claims. Components illustrated and described herein are merely examples of a system/device and components that may be used to implement embodiments of the disclosure and may be replaced with other devices and components without departing from the scope of the claims. Furthermore, any dimensions, degrees, and/or numerical ranges provided herein are to be understood as non-limiting examples unless otherwise specified in the claims.

What is claimed:

1. A circuit board separation mechanism, comprising:
   a separation block positioned within a separation block cut-out of a heatsink, the heatsink positioned between a first circuit board and a second circuit board, the first circuit board including a first component of at least one connector and the second circuit board including a second component of the at least one connector;
   a set screw inserted in the separation block, at least a portion of the set screw configured to engage a surface of the heatsink, the separation block being configured to lift against a surface of the first circuit board when the set screw is rotated; and
   at least one actuation inhibitor, the at least one actuation inhibitor inserted in an auxiliary channel via an auxiliary opening in a surface of the separation block,
   the first component of the at least one connector and the second component of the at least one connector being configured to separate when the set screw is rotated and the separation block lifts against the surface of the first circuit board.

2. The circuit board separation mechanism of claim 1, the set screw configured to engage a set screw groove in the surface of the heatsink.

3. The circuit board separation mechanism of claim 2, the set screw being tightened against the set screw groove when rotated.

4. The circuit board separation mechanism of claim 1, the set screw accessed via a primary channel within the separation block, the primary channel accessed via a primary opening in a surface of the separation block, the primary opening accessed via an opening within the second circuit board.

5. The circuit board separation mechanism of claim 1, the separation block including at least one keyed section configured to mate with at least one corresponding groove within the separation block cut-out of the heatsink.

6. The circuit board separation mechanism of claim 1, the at least one actuation inhibitor being inserted in at least one actuation inhibitor cut-out in the heatsink, the at least one actuation inhibitor cut-out accessible via the auxiliary channel.

7. The circuit board separation mechanism of claim 1, the at least one actuation inhibitor configured to engage a surface in the auxiliary channel when the set screw rotates, the separation block lifts against the surface of the first circuit board, and a selected amount of actuation occurs, the engaging of the surface in the auxiliary channel preventing actuation of the separation block beyond the selected amount of actuation.

8. The circuit board separation mechanism of claim 1, the at least one connector including at least one Switch Mezzanine Card (XMC) connector.

9. The circuit board separation mechanism of claim 8, the heatsink including at least one XMC opening configured to receive the at least one XMC connector when the at least one XMC connector is mated.

10. The circuit board separation mechanism of claim 9, the at least one XMC connector including two XMC connectors, the at least one XMC opening including two XMC openings, the separation block cut-out positioned in the heatsink between the two XMC openings.

11. The circuit board separation mechanism of claim 1, the at least one connector including at least one Peripheral Component Interconnect (PCI) Mezzanine Card (PMC) connector.

12. The circuit board separation mechanism of claim 11, the heatsink including at least one PMC opening configured to receive the at least one PMC connector when the at least one PMC connector is mated.

13. The circuit board separation mechanism of claim 1, the first circuit board including a mezzanine card, the second circuit board including a base card.

14. An avionics module assembly, comprising:
   a first circuit board including a first component of at least one connector;
   a second circuit board including a second component of the at least one connector;
   a heatsink positioned between the first circuit board and the second circuit board; and
   a circuit board separation mechanism, comprising:
      a separation block positioned in a separation block cut-out of the heatsink;
      a set screw inserted within the separation block cut-out, at least a portion of the set screw configured to engage a surface of the heatsink, the separation block being configured to lift against a surface of the first circuit board when the set screw is rotated; and at least one actuation inhibitor, the at least one actuation inhibitor inserted in an auxiliary channel via an auxiliary opening in a surface of the separation block, the first component of the at least one connector and the second component of the at least one connector being configured to separate when the set screw is rotated and the separation block lifts against the surface of the first circuit board.

\* \* \* \* \*